(12) United States Patent
Frank

(10) Patent No.: US 7,564,316 B2
(45) Date of Patent: Jul. 21, 2009

(54) VARIABLE-FREQUENCY OSCILLATOR INCORPORATING THIN-FILM BULK ACOUSTIC RESONATORS

(75) Inventor: Michael L. Frank, Menlo Park, CA (US)

(73) Assignee: Avago Technologies Wireless IP (Singapore) Pte. Ltd., Singapore (SG)

( * ) Notice: Subject to any disclaimer, the term of this patent is extended or adjusted under 35 U.S.C. 154(b) by 48 days.

(21) Appl. No.: 11/318,006

(22) Filed: Dec. 23, 2005

(65) Prior Publication Data
US 2007/0146086 A1 Jun. 28, 2007

(51) Int. Cl.
*H03B 5/32* (2006.01)
(52) U.S. Cl. ............... 331/107 A; 331/2; 331/48; 331/116 M
(58) Field of Classification Search ............. 331/107 A, 331/2, 116 M, 48
See application file for complete search history.

(56) References Cited

U.S. PATENT DOCUMENTS

| 5,016,260 | A | * | 5/1991 | Masuda | ............ 375/307 |
| 5,396,195 | A | | 3/1995 | Gabara | |
| 5,418,497 | A | * | 5/1995 | Martin | ............ 331/48 |
| 5,561,399 | A | | 10/1996 | Haartsen | |
| 6,198,360 | B1 | | 3/2001 | Henrion | |
| 6,262,637 | B1 | | 7/2001 | Bradley et al. | |
| 6,744,327 | B2 | | 6/2004 | Toncich et al. | |
| 2004/0257165 | A1 | | 12/2004 | Lee et al. | |
| 2005/0099236 | A1 | | 5/2005 | Kawakubo et al. | |

OTHER PUBLICATIONS

Nhat M. Nguyen et al., A 1.8-GHz Monolithic LC Voltage-Controlled Oscillator, IEEE Jornal of Solid State Circuits, vol. 27, No. 3, pp. 444-450, Mar. 1992.
Brian P. Otis, "A 300 uW 1.9-GHz CMOS Oscillator Utilizing Micromachined Resonators," IEEE Journal of Solid State Circuits, vol. 38, No. 7, pp. 1271-1274 (Jul. 2003).
Nhat M. Nguyen and Robert G. Meyer, A 1.8-GHz Monolithic LC Voltage-Controlled Oscillator, IEEE Journal of Solid-State Circuits, vol. 27, No. 3, Mar. 1992.

* cited by examiner

*Primary Examiner*—Benny Lee
*Assistant Examiner*—James E Goodley

(57) ABSTRACT

Variable-frequency oscillators incorporating thin-film bulk acoustic resonators (FBARs) are described. In one aspect, a variable-frequency oscillator includes a first oscillator circuit and a second oscillator circuit. The first oscillator circuit includes a first film bulk acoustic resonator that has a first resonant frequency. The second oscillator circuit is coupled to the first oscillator circuit and includes a second FBAR that has a second resonant frequency different from the first resonant frequency. At least one current source is coupled to the first and second oscillator circuits and is operable to supply a total current. A bias circuit is operable to apply to the first and second oscillator circuits respective biases that control apportionment of the total current to the first and second oscillators.

20 Claims, 6 Drawing Sheets

VARIABLE-FREQUENCY OSCILLATOR INCORPORATING THIN-FILM BULK ACOUSTIC RESONATORS

BACKGROUND

An oscillator produces a periodic time-varying output signal. The output signal may be used, for example, as an information-carrying signal or as a timing signal for signal processing circuits. A variable-frequency oscillator (VFO) is an oscillator that produces an output signal at a frequency that can be varied controllably over a range of frequencies. A voltage-controlled oscillator (VCO) is a variable-frequency oscillator that produces an output signal with a variable frequency that is controlled by an applied tuning voltage.

A common type of variable-frequency oscillator is an LC voltage-controlled oscillator, which includes a tank circuit coupled in a feedback loop with an amplifier. The tank circuit includes an inductor and a variable capacitance element, which typically is implemented by a varactor diode. Both the inductor and the variable capacitor element, however, are associated with low quality values (Q-values), which tend to degrade the performance of the oscillator by increasing the phase noise, especially at high frequencies. The Q-value measures the ratio between the stored energy and lost energy per oscillation cycle.

In an effort to eliminate the performance-degrading impact of the variable capacitor elements, varactor-free voltage-controlled oscillators have been proposed. In one such approach, a cross-coupled LC voltage-controlled oscillator includes two LC-tuned resonator circuits with different resonant frequencies and a Gilbert multiplier cell that varies the loop transmission that is applied to each resonator circuit (see, e.g., Nhat M. Nguyen et al., "A 1.8-GHz Monolithic LC Voltage-Controlled Oscillator," IEEE Journal of Solid-State Circuits, vol. 27, no. 3, pp. 444-450, March 1992). In this approach, the oscillation frequency is varied continuously between the resonant frequencies of the two resonator circuits by varying the relative proportions of current flowing through the two resonator circuits. This approach, however, does not eliminate the performance-degrading impact of the required planar inductors, which tend to have low Q-values in monolithic circuit designs because of resistive losses and substrate losses.

What is needed is a variable-frequency oscillator that avoids the performance limitations associated with variable capacitance elements and planar inductors in the resonator portions of the oscillator.

SUMMARY

In one aspect, the invention features a variable-frequency oscillator that includes a first oscillator circuit and a second oscillator circuit. The first oscillator circuit includes a first film bulk acoustic resonator (FBAR) that has a first resonant frequency. The second oscillator circuit is coupled to the first oscillator circuit and includes a second FBAR that has a second resonant frequency different from the first resonant frequency. At least one current source is coupled to the first and second oscillator circuits and is operable to supply a total current. A bias circuit is operable to apply to the first and second oscillator circuits respective biases that control apportionment of the total current to the first and second oscillators.

The invention also features a device that has a phase-locked loop that includes the inventive variable-frequency oscillator described above.

Other features and advantages of the invention will become apparent from the following description, including the drawings and the claims.

DETAILED DESCRIPTION

In the following description, like reference numbers are used to identify like elements. Furthermore, the drawings are intended to illustrate major features of exemplary embodiments in a diagrammatic manner. The drawings are not intended to depict every feature of actual embodiments nor relative dimensions of the depicted elements, and are not drawn to scale.

The embodiments that are described in detail below provide variable-frequency oscillators that avoid the performance limitations associated with variable capacitance elements and planar inductors that typically are included in the resonator portions of variable-frequency oscillators. In particular, these embodiments include film bulk acoustic resonators that define two different resonant frequencies between which the output frequency may be tuned controllably. The high Q-values that are characteristic of FBARs should allow these embodiments to be implemented with substantially lower noise than comparable variable-frequency oscillators that require planar inductors in the tuned resonator circuits.

Figure 1:
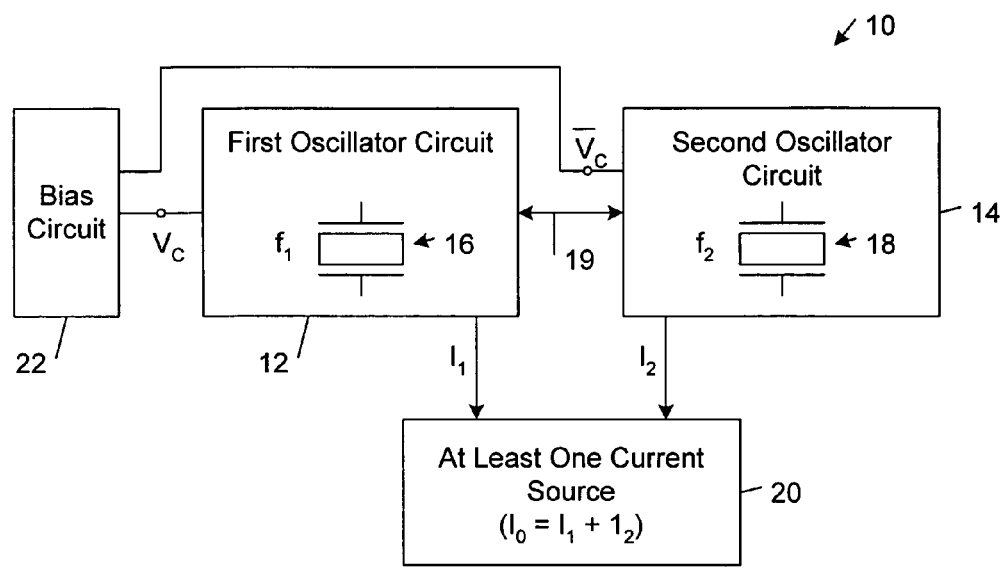
FIG. 1 is a block diagram of an embodiment of a variable-frequency oscillator in accordance with the invention.

FIG. 1 shows an embodiment of a variable-frequency oscillator 10 that includes a first oscillator circuit 12 and a second oscillator circuit 14. The first oscillator circuit 12 includes a first film bulk acoustic resonator (FBAR) 16 that has a first resonant frequency ($f_1$). The second oscillator circuit 14 is coupled to the first oscillator circuit 12 and includes a second FBAR 18 that has a second resonant frequency ($f_2$) different from the first resonant frequency. The first and second oscillators 12, 14 are interconnected electrically as indicated by the double-headed arrow 19.

At least one current source 20 is coupled to the first and second oscillator circuits 12, 14. In the illustrated embodiment, the at least one current source supplies a total current ($I_0$) to the first and second oscillator circuits 12, 14. As shown in FIG. 1, the total current $I_0$ is apportioned between the first and second oscillator circuits 12, 14 in respective portions $I_1$, and $I_2$ that sum to the total current $I_0$ (i.e., $I_0=I_1+I_2$).

A bias circuit 22 respectively applies to the first and second oscillator circuits 12, 14 control biases ($V_C$, $\overline{V}_C$) that control the apportionment of the total current to the first and second oscillators 12, 14. The control biases ($V_C$, $\overline{V}_C$) correspond to two voltage levels (e.g., ON and OFF) that are applied in a complementary way. For example, in one embodiment in accordance with the invention, the bias circuit 22 applies an ON voltage to the first oscillator circuit and an OFF voltage to the second oscillator circuit 14 in a first biasing state, and the bias circuit 12 applies the OFF voltage level to the first oscillator circuit 12 and the ON voltage to the second oscillator circuit 14 in a second biasing state. The oscillating frequency of the variable-frequency oscillator 10 can be carried by varying the control bias levels ($V_C$, $\overline{V}_C$) between the On and OFF voltage levels in a complementary way as shown, for example, in FIG. 2. The control bias levels may have equal magnitudes at or near the mean frequency between $f_1$, and $f_2$.

Figure 2:
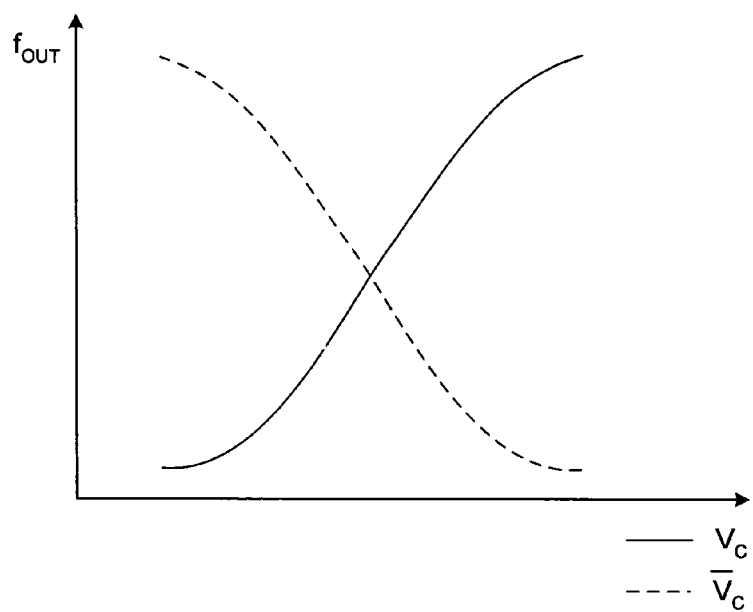
FIG. 2 shows a devised graph of the expected output frequency ($f_{OUT}$) plotted as a function of the applied control bias $V_C$ for an implementation of the variable-frequency oscillator shown in FIG. 1.

In operation, the relative proportions of the total current $I_0$ flowing through the first and second oscillator circuits 12, 14 determines the operating frequency of the variable-frequency oscillator 10. In particular, when the total current $I_0$ is apportioned to the first oscillator circuit 12 (i.e., $I_2=0$), the operating frequency of the variable-frequency oscillator 10 is $f_1$. When the total current $I_0$ is apportioned to the second oscillator circuit 14 (i.e., $I_1=0$), the operating frequency of the variable-frequency oscillator 10 is $f_2$. When some of the total current $I_0$ is apportioned to both the first oscillator circuit 12 and the second oscillator circuit 12 (i.e., $I_1>0$ and $I_2>0$), the operating frequency of the variable-frequency oscillator 10 is between $f_1$ and $f_2$. FIG. 2 shows a devised graph of the expected output frequency ($f_{OUT}$) plotted as a function of the applied control bias $V_C$ for an implementation of the variable-frequency oscillator 10 in which the control biases ($V_C$, $\overline{V}_C$) have equal magnitudes and opposite polarities (i.e., $V_C=-\overline{V}_C$).

Figure 3A:
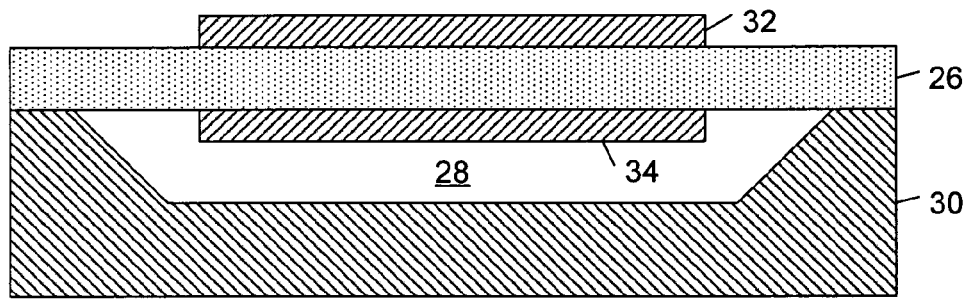
FIG. 3A is a diagrammatic cross-sectional view of an embodiment of a film bulk acoustic resonator (FBAR) structure.

FIG. 3A shows an exemplary FBAR structure 24, which may be used to implement the FBARs 16, 18 in some embodiments in accordance with the invention. The FBAR structure 24 includes a planar piezoelectric layer 26 suspended at its periphery over a cavity 28 that is formed in a substrate 30. Two electrodes 32 and 34 are located on opposite surfaces of the portion of the piezoelectric layer 26 that is suspended over the cavity 28. The piezoelectric layer 26 and the electrodes 32, 34 form the piezoelectric resonator stack, which expands and contracts in a direction perpendicular to the planar piezoelectric layer 26 in response to the magnitude and polarity of a voltage that is applied across the electrodes 32, 34. The piezoelectric resonator stack resonates when the electrodes 32, 34 are biased by signal that has a frequency equal to the velocity of sound in the piezoelectric resonator stack divided by twice the weighted thickness of the resonator stack.

Figure 3B:
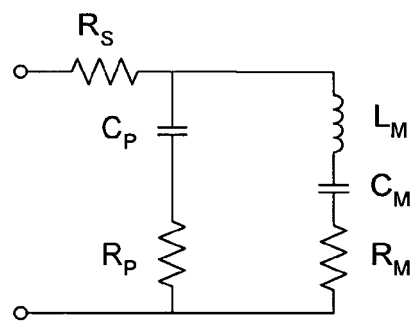
FIG. 3B is a circuit diagram of an equivalent circuit representation of the FBAR structure shown in FIG. 3A.

FIG. 3B shows an equivalent circuit of the FBAR structure 24. The main reactive component of the FBAR structure 24 is the shunt capacitance $C_P$, which is the capacitance of the capacitor formed by the electrodes 32, 34 and the piezoelectric layer 26. The resistor $R_P$ represents the series resistance of the shunt capacitance $C_P$. The inductance $L_M$ and the capacitance $C_M$ represent the inductance and capacitance of the piezoelectric resonator stack. The resistor $R_M$ represents the loss in the piezoelectric resonator stack and the resistor $R_S$ represents the series electrical resistance of the connections between the terminals connected to the electrodes 32, 34 of the piezoelectric resonator stack.

Figure 3C:
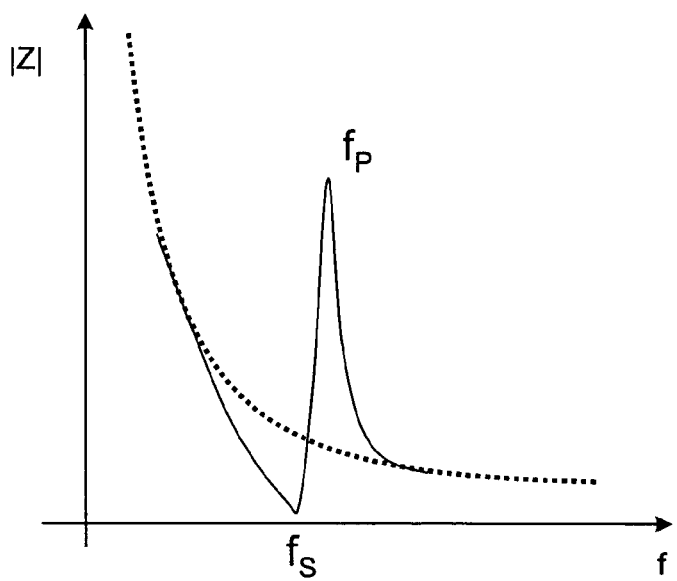
FIG. 3C is a graph of the modulus of impedance |Z| plotted as a function of frequency (f) for an implementation of the FBAR structure shown in FIG. 3A.

FIG. 3C is a graph of the modulus of the impedance |Z| plotted as a function of frequency (f). The solid line corresponds to the modulus of the impedance measured between the terminals connected to the electrodes 32, 34 of the FBAR structure 24 plotted as a function of frequency (f), and the dashed line corresponds to the modulus of the impedance of a simple capacitor plotted as a function of frequency (f). As the frequency increases, the impedance |Z| of the FBAR structure 24 decreases due to the decreasing impedance of the shunt capacitance $C_P$. The impedance |Z| of the FBAR structure 24 reaches a minimum at the frequency ($f_S$) of the series resonance between the mechanical inductance $L_M$ and the mechanical capacitance $C_M$. As the frequency continues to increase, the impedance of the FBAR structure 24 increases and reaches a maximum at the frequency ($f_P$) of the parallel resonance between the mechanical inductance $L_M$ and the series combination of the mechanical capacitance $C_M$ and the shunt capacitance $C_P$. As used herein, the resonant frequency of an FBAR corresponds to the frequency of the parallel resonance of the FBAR unless explicitly stated to the contrary. As the frequency increases above the frequency of the parallel resonance, the impedance |Z| of the FBAR structure 24 decreases. The shunt capacitance $C_P$ of the FBAR structure 24 typically is much higher than the mechanical capacitance $C_M$. As a result, the frequency difference between the series and parallel resonances ($f_S$, $f_P$) of the FBAR structure 24 typically is small.

Figure 4:
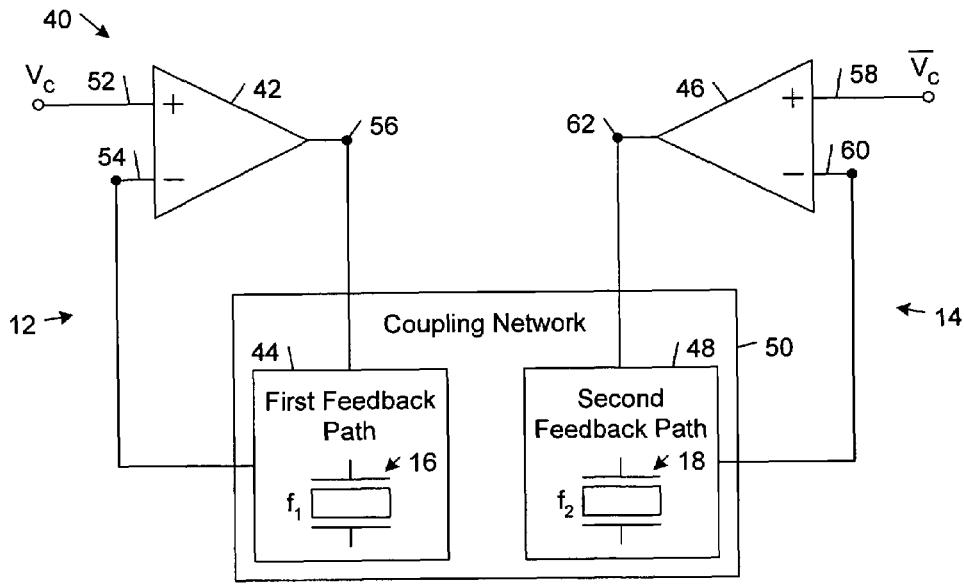
FIG. 4 is a block diagram of an embodiment of the variable-frequency oscillator shown in FIG. 1.

FIG. 4 shows a block diagram of an embodiment 40 of the variable-frequency oscillator 10 in which the first oscillator circuit 12 includes a first amplifier 42 and a first feedback path 44 incorporating the first FBAR 16, and the second oscillator circuit 14 includes a second amplifier 46 and a second feedback path 48 incorporating the second FBAR 18. The first and second feedback paths 44, 48 are interconnected electrically by a coupling network 50. The first amplifier 42 includes a first input 52, a second input 54, and an output 56. The first feedback path 44 couples the first FBAR 16 to the second input 54 of the first amplifier 42 and the output 56 of the first amplifier 42. The second amplifier 46 includes a first input 58, a second input 60, and an output 62. The second feedback path 48 couples the second FBAR 18 to the second input 60 of the second amplifier 46 and the output 62 of the second amplifier 46. The bias circuit 22 applies the complementary biases ($V_C$, $\overline{V}_C$) to the first inputs 52, 58 of the first and second amplifiers 42, 46. In general, the variable-frequency oscillator 40 may be implemented using any type of integrated circuit technology, including bipolar, CMOS, BiCMOS, and other silicon and III-V semiconductor integrated circuit technologies.

Figure 5:
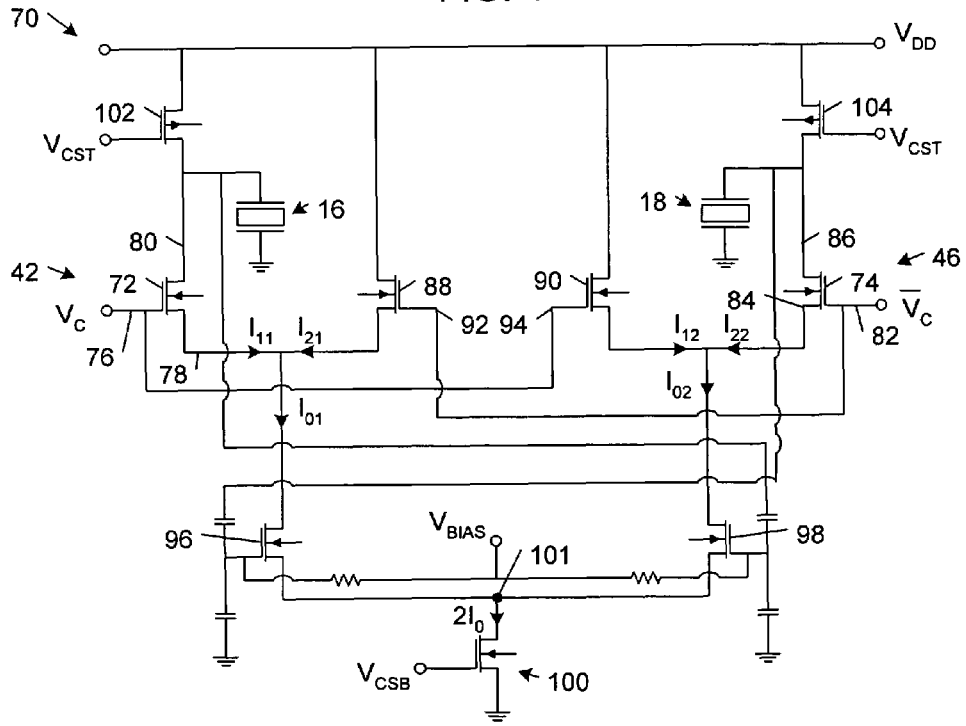
FIG. 5 is a circuit diagram of an embodiment of the variable-frequency oscillator shown in FIG. 1.

FIG. 5 shows a circuit diagram of an embodiment 70 of the variable-frequency oscillator 40 that is implemented using CMOS transistors. In this embodiment 70, the first amplifier 42 is implemented by a first transistor 72 and the second amplifier 46 is implemented by a second transistor 74. The first transistor 72 includes a control terminal 76 (gate), an input terminal 78 (source), and an output terminal 80 (drain). The second transistor 74 also includes a control terminal 82 (gate), an input terminal 84 (source), and an output terminal 86 (drain). The bias circuit 22 applies the complementary control biases ($V_C$, $\overline{V}_C$) to the input terminals 76, 82 of the first and second transistors 72, 74. The first and second feedback paths 44, 46 include a differential pair of transistors 96, 98 The sources of the transistors 96, 98 are coupled at a summing node 101, which constitutes the coupling network 50. The summing node 101 interconnects the first and second feedback paths 44, 48, which are illustrated in FIGS. 6A and 6B.

Figure 6A:
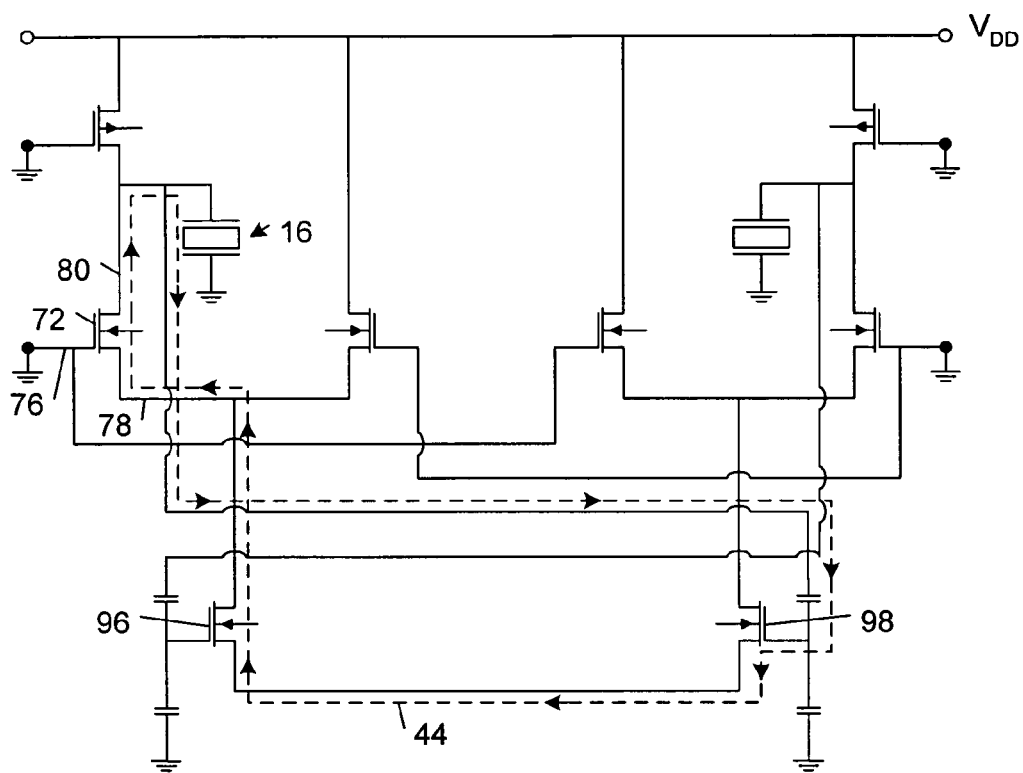
FIG. 6A is a simplified alternating current circuit diagram of the variable-frequency oscillator embodiment of FIG. 5 highlighting a first feedback path of a first oscillator circuit.

FIG. 6A shows a simplified alternating current circuit diagram of the variable-frequency oscillator embodiment 70 highlighting the first feedback path 44 of a first oscillator circuit. The first feedback path 44 couples the first FBAR 16 to the input terminal 78 and the output terminal 80 of the first transistor 72. In particular, the first feedback path 44 traverses from the output terminal 80 of the first transistor 72, through the control and input terminals of the transistor 98, through the input and output terminals of the transistor 96, to the input terminal 78 of the first transistor 72.

Figure 6B:
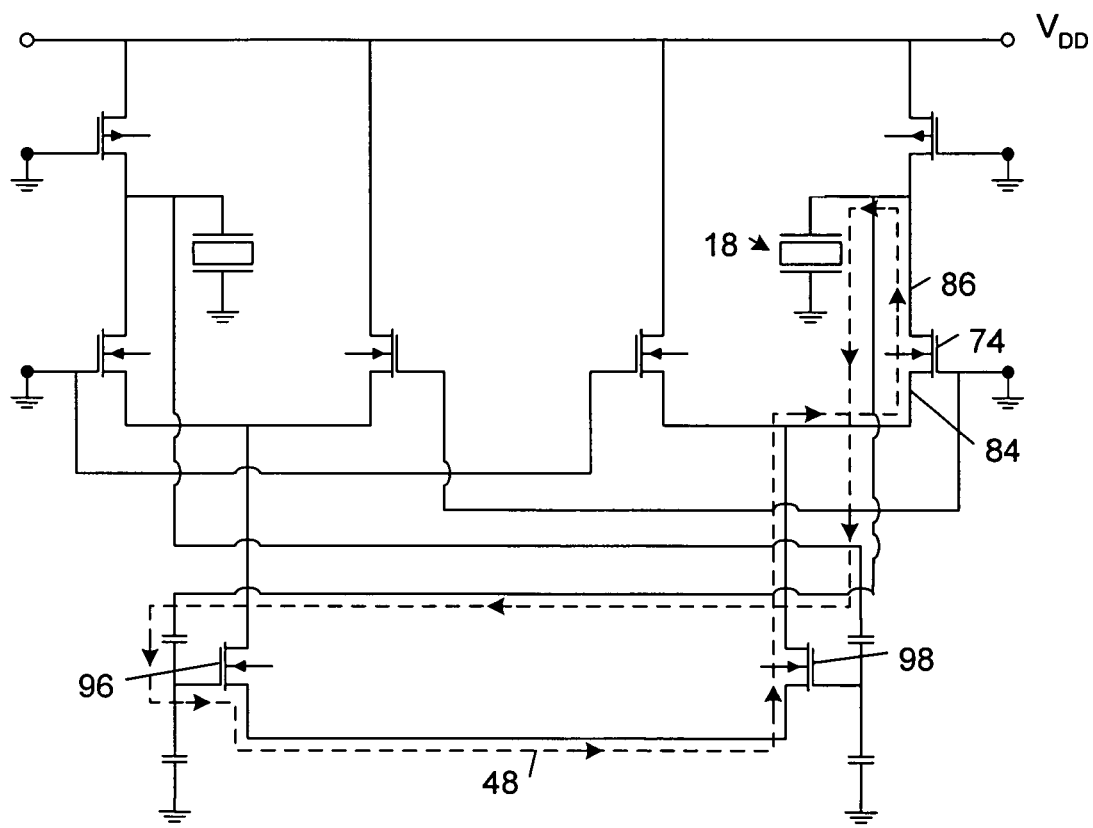
FIG. 6B is a simplified alternating current circuit diagram of the variable-frequency oscillator embodiment of FIG. 5 highlighting a second feedback path of a second oscillator circuit.

FIG. 6B shows a simplified alternating current circuit diagram of the variable-frequency oscillator embodiment 70 highlighting the second feedback path 48 of a second oscillator circuit. The second feedback path 48 couples the second FBAR 18 to the input terminal 84 and the output terminal 86 of the second transistor 74. In particular, the second feedback path 48 traverses from the output terminal 86 of the second transistor 74, through the control and input terminals of the transistor 96, through the input and output terminals of the transistor 98, to the input terminal 84 of the second transistor 74.

Referring back to FIG. 5, a p-channel CMOS transistor 102 provides current to the drain 80 of the first transistor 72 and isolates the first FBAR 16 from the voltage rail $V_{DD}$. Similarly, a p-channel CMOS transistor 104 provides current to the drain 86 of the second transistor 74 and isolates the second FBAR 18 from the voltage rail $V_{DD}$.

The first transistor 72 is coupled to a fifth transistor 88 in a differential pair configuration and the second transistor 74 is coupled to a sixth transistor 90 in a differential pair configuration. The control terminals 92, 94 of the fifth and sixth transistors 88, 90 are biased by the control bias levels that are complementary to the control bias levels that are applied to the control terminals 76, 82 of the first and second transistors 72, 74. In this way, the fifth and sixth transistors 88, 90 provide alternative current paths for the sets of apportioned currents $I_{11}$, $I_{21}$ and $I_{12}$, $I_{22}$, respectively.

The oscillator currents $I_{11}$, $I_{21}$ and $I_{12}$, $I_{22}$ are supplied by the differential pair of transistors 96, 98. In particular, the transistor 96 provides a total current $I_{01}=I_{11}+I_{21}$ and the transistor 98 provides a total current $I_{02}=I_{12}+I_{22}$. In this embodiment 70, transistors 96, 98 are biased by a common bias $V_{BIAS}$, which sets the total currents supplied by the transistors 96, 98 to substantially equal relative levels (i.e., $I_{01}=I_{02}$). A current source 100 supplies a total current level of $2I_0$, which is divided equally among the transistors 96, 98. In operation, when $V_C$ is high and $\overline{V}_C$ is low, the current $I_{11}=I_0$ will flow through the first oscillator circuit 12 and the frequency of the variable-frequency oscillator 70 will correspond to $f_1$. When $\overline{V}_C$ is high and $V_C$ is low, the current $I_{21}=I_0$ will flow through the second oscillator circuit 14 and the frequency of the variable-frequency oscillator 70 will correspond to $f_2$.

In general, the variable-frequency oscillator embodiments that are described herein may be incorporated in a wide variety of different circuits, including clock generation circuits, carrier signal generation circuits, sweep voltage generation circuits, phase-locked loop circuits, and frequency synthesizer circuits.

In some embodiments, the FBARs are implemented in silicon and die-attached to other components (e.g., a transceiver) of an integrated circuit device, thereby reducing the overall size of the device, reducing the number of input/output connections required for the device, and improving the thermal matching between the FBARs and the other components of the device.

Figure 7:
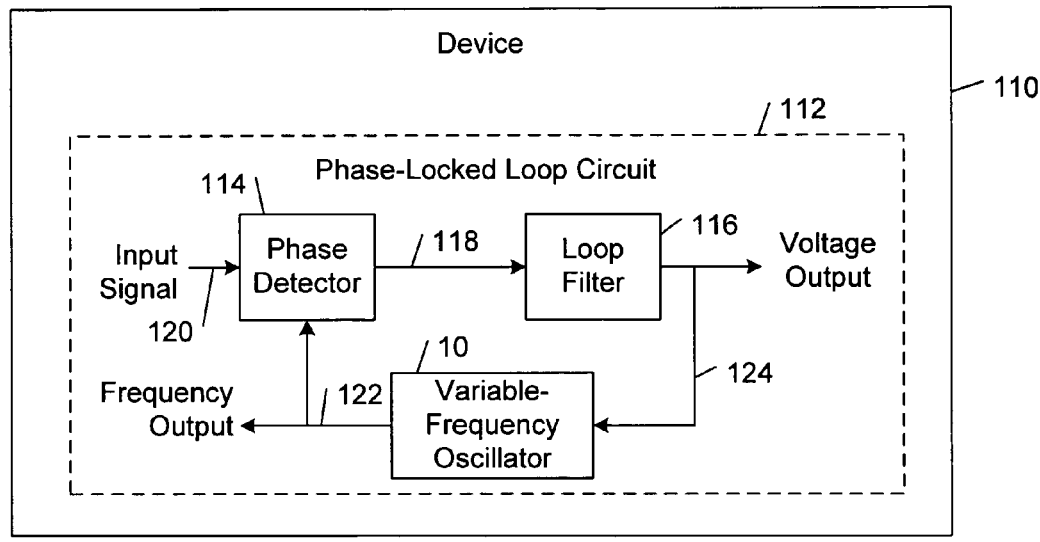
FIG. 7 is a block diagram of an embodiment of a device that has an embodiment of a phase-locked loop that includes the variable-frequency oscillator shown in FIG. 1.

FIG. 7 shows an embodiment of a device 110 in accordance with the invention. The device 110 includes an embodiment of a phase-locked loop circuit 112 that incorporates an embodiment of the variable-frequency oscillator 10 (FIG. 1). The device 110 may be, for example, a telecommunications device (e.g., a cellular telephone), a remote control device, an entertainment device (e.g., a digital radio), a memory device (e.g., disk drive), or a computing device. The phase-locked loop circuit 112 includes a feedback system that is formed from a phase detector 114, a loop filter 116, and the variable-frequency oscillator 10. In operation, the phase detector 114 generates an error signal 118 based on the comparison between the phases of the input signal 120 and the output signal 122 of the variable-frequency oscillator 10. The loop filter 116 filters the error signal 118 to produce a filtered error signal 124, which is applied to the control input of the variable-frequency oscillator 10. The filtered error signal 124 causes the variable-frequency oscillator 10 to synchronize to the frequency of the input signal 120.

Figure 8:
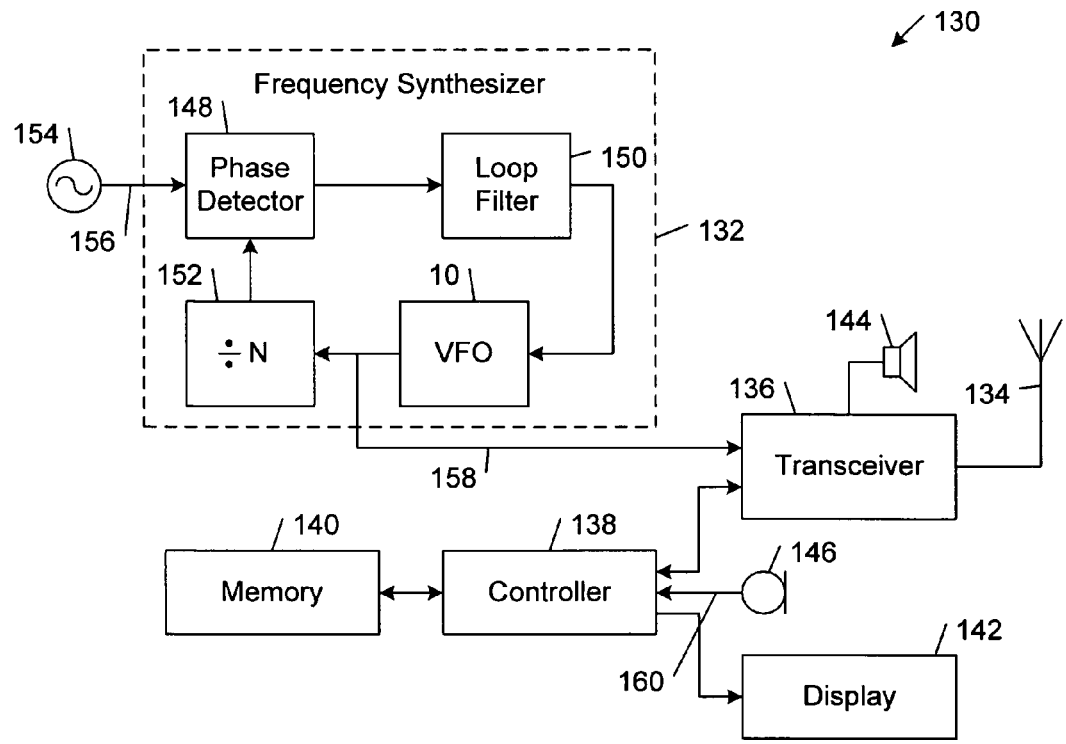
FIG. 8 is a block diagram of an embodiment of a communication device that has an embodiment of a frequency synthesizer that includes the variable-frequency oscillator shown in FIG. 1.

FIG. 8 shows an embodiment of a communication device 130 in accordance with the invention. The communication device 130 may be, for example, a telecommunication device, such as a cellular telephone. The communication device 130 includes an embodiment of a frequency synthesizer 132 that incorporates the variable-frequency oscillator 10 (FIG. 1). The device 130 also includes an antenna 134, a transceiver 136, a controller 138, a memory 140, a display 142, a speaker 144, and a microphone 146. The frequency synthesizer 132 includes a phase detector 148, a loop filter 150, the variable-frequency oscillator 10, and a frequency divider 152. A clock circuit 154 provides a reference signal 156 to the input of the phase detector 148. The frequency ($f_{VFO}$) of the output signal 158 that is generated by the variable-frequency oscillator 10 is equal to N times the frequency ($f_{ref}$) of the reference signal 156 (i.e., $f_{VFO}=N \cdot f_{ref}$), where N is the modulus of the frequency divider 152. The controller 138 sets the frequency of the output signal 158 that is generated by the frequency synthesizer 132 to integer multiples of the reference frequency by selectively changing the frequency divider modulus N. The frequency divider output signal 158 is used by the transceiver 136 to modulate transmit signals that are transmitted from the antenna 134 and to demodulate receive signals that are received by the antenna 134. Received data signals are presented on the display 142 and received audio signals are output from the speaker 144. The microphone 146 generates an audio input signal 160, which is used to modulate the output signal 158 of the frequency synthesizer 132.

The embodiments that are described in detail herein provide variable-frequency oscillators that avoid the performance limitations associated with variable capacitance elements and planar inductors that typically are included in the resonator portions of variable-frequency oscillators. In particular, these embodiments include film bulk acoustic resonators that define two different resonant frequencies between which the output frequency may be tuned controllably. The high Q-values that are characteristic of FBARs should allow these embodiments to be implemented with substantially lower noise than comparable variable-frequency oscillators that require planar inductors in the tuned resonator circuits.

Other embodiments are within the scope of the claims.

What is claimed is:

1. A variable-frequency oscillator, comprising:
   a first oscillator circuit comprising a first film bulk acoustic resonator (FBAR) having a first resonant frequency;

a second oscillator circuit coupled to the first oscillator circuit and comprising a second FBAR having a second resonant frequency different from the first resonant frequency;

at least one current source coupled to the first and second oscillator circuits and operable to supply a total current; and a bias circuit configured to apply to the first and second oscillator circuits respective biases to control apportionment of the total current variably between the first and second oscillators.

2. The variable-frequency oscillator of claim 1, wherein: the first oscillator circuit comprises a first amplifier having a first input, a second input, and an output, and a first feedback path coupling the first FBAR to the second input of the first amplifier and the output of the first amplifier; and the second oscillator circuit comprises a second amplifier having a first input, a second input, and an output, and a second feedback path coupled to the first feedback path and coupling the second FBAR to the second input of the second amplifier and the output of the second amplifier.

3. The variable-frequency oscillator of claim 2, wherein the bias circuit applies the respective biases to the first inputs of the first and second amplifiers.

4. The variable-frequency oscillator of claim 3, wherein the bias circuit applies complementary biases to the first inputs of the first and second amplifiers.

5. The variable-frequency oscillator of claim 2, wherein: the first oscillator circuit comprises a first transistor having a control terminal corresponding to the first input of the first amplifier, an input terminal corresponding to the second input of the first amplifier, and an output terminal corresponding to the output of the first amplifier; and the second oscillator circuit comprises a second transistor having a control terminal corresponding to the first input of the second amplifier, an input terminal corresponding to the second input of the second amplifier, and an output terminal corresponding to the output of the second amplifier.

6. The variable-frequency oscillator of claim 5, wherein: the first oscillator additionally comprises a third transistor having a control terminal coupled to the input terminal of the second transistor, an input terminal coupled to the input terminal of the first transistor, and an output terminal; and the second oscillator additionally comprises a fourth transistor having a control terminal coupled to the input terminal of the first transistor, an input terminal coupled to the input terminal of the second transistor, and an output terminal.

7. The variable-frequency oscillator of claim 5, wherein the first FBAR has an input coupled to the output of the first transistor and the second FBAR has an input coupled to the output of the second transistor.

8. The variable-frequency oscillator of claim 7, wherein: the first oscillator comprises a fifth transistor having a control terminal, an input terminal, and an output terminal coupled to the input of the first FBAR and the output of the first transistor; and the second oscillator comprises a sixth transistor having a control terminal, an input terminal, and an output terminal coupled to the input of the second FBAR and the output of the second transistor.

9. The variable-frequency oscillator of claim 2, wherein the first and second feedback paths comprise first and second transistors, each of the first and second transistors have a control terminal, an input terminal, and an output terminal, and the input terminals of the first and second transistors are interconnected.

10. The variable-frequency oscillator of claim 9, wherein the first feedback path traverses the control and input terminals of the second transistor and the input and output terminals of the first transistor, and the second feedback path traverses the control and input terminals of the first transistor and the input and output terminals of the second transistor.

11. The variable-frequency oscillator of claim 9, wherein the control terminals of the first and second transistors are coupled to a common bias terminal.

12. The variable-frequency oscillator of claim 1, wherein each of the first and second oscillator circuits comprises first and second transistors coupled in a differential pair configuration.

13. A variable-frequency oscillator, comprising:

first oscillating means comprising a first film bulk acoustic resonator (FBAR) having a first resonant frequency;

second oscillating means coupled to the first oscillating means and comprising a second FBAR having a second resonant frequency different from the first resonant frequency;

current sourcing means to the first and second oscillating means and operable to supply a total current; and biasing means configured to apply to the first and second oscillating means respective biases to control apportionment of the total current variably between the first and second oscillating means.

14. The variable-frequency oscillator of claim 13, wherein: the first oscillating means comprises first amplifying means having a first input, a second input, and an output, and a first feedback means coupling the first FBAR to the second input of the first amplifying means and the output of the first amplifying means; and the second oscillating means comprises a second amplifying means having a first input, a second input, and an output, and a second feedback means coupled to the first feedback means and coupling the second FBAR to the second input of the second amplifying means and the output of the second amplifying means.

15. The variable-frequency oscillator of claim 14, wherein the biasing means applies complementary biases to the first inputs of the first and second amplifying means.

16. The variable-frequency oscillator of claim 14, wherein: the first oscillating means comprises a first transistor means having a control terminal corresponding to the first input of the first amplifying means, an input terminal corresponding to the second input of the first amplifying means, and an output terminal corresponding to the output of the first amplifying means; and the second oscillating means comprises a second transistor means having a control terminal corresponding to the first input of the second amplifying means, an input terminal corresponding to the second input of the second amplifying means, and an output terminal corresponding to the output of the second amplifying means.

17. A device, comprising:

a phase-locked loop comprising a variable-frequency oscillator, the variable-frequency oscillator comprising:

a first oscillator circuit comprising a first film bulk acoustic resonator (FBAR) having a first resonant frequency;

a second oscillator circuit coupled to the first oscillator circuit and comprising a second FBAR having a second resonant frequency different from the first resonant frequency;

at least one current source coupled to the first and second oscillator circuits and operable to supply a total current; and a bias circuit configured to apply to the first and second oscillator circuits respective biases to control apportionment of the total current variably between the first and second oscillators.

18. The device of claim 17, wherein: the first oscillator circuit comprises a first amplifier having a first input, a second input, and an output, and a first feedback path coupling the first FBAR to the second input of the first amplifier and the output of the first amplifier; and the second oscillator circuit comprises a second amplifier having a first input, a second input, and an output, and a second feedback path coupled to the first feedback path and coupling the second FBAR to the second input of the second amplifier and the output of the second amplifier.

19. The device of claim 18, wherein the bias circuit applies complementary biases to the first inputs of the first and second amplifiers.

20. The device of claim 18, wherein: the first oscillator circuit comprises a first transistor having a control terminal corresponding to the first input of the first amplifier, an input terminal corresponding to the second input of the first amplifier, and an output terminal corresponding to the output of the first amplifier; and the second oscillator circuit comprises a second transistor having a control terminal corresponding to the first input of the second amplifier, an input terminal corresponding to the second input of the second amplifier, and an output terminal corresponding to the output of the second amplifier.

* * * * *